(12) United States Patent
Zhao et al.

(10) Patent No.: US 11,662,326 B2
(45) Date of Patent: May 30, 2023

(54) METHOD FOR CALCULATING LIQUID-SOLID INTERFACE MORPHOLOGY DURING GROWTH OF INGOT

(71) Applicant: Zing Semiconductor Corporation, Shanghai (CN)

(72) Inventors: Yan Zhao, Shanghai (CN); Nan Zhang, Shanghai (CN); Qiang Chen, Shanghai (CN); Hanyi Huang, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 79 days.

(21) Appl. No.: 17/167,417

(22) Filed: Feb. 4, 2021

(65) Prior Publication Data
US 2022/0163470 A1 May 26, 2022

(30) Foreign Application Priority Data
Nov. 23, 2020 (CN) .......................... 202011324456.5

(51) Int. Cl.
*C30B 15/22* (2006.01)
*G01N 27/04* (2006.01)

(52) U.S. Cl.
CPC .................. *G01N 27/041* (2013.01)

(58) Field of Classification Search
CPC ......... C30B 29/06; C30B 15/04; C30B 15/20; C30B 25/02; C30B 15/00; C30B 29/36; H01L 21/20; H01L 31/18; G01N 27/041; G11C 13/0007

USPC ....................................................... 324/71.5
See application file for complete search history.

(56) References Cited

U.S. PATENT DOCUMENTS

2009/0039478 A1* 2/2009 Bucher ................... C30B 11/04
257/E21.531
2012/0056135 A1* 3/2012 DeLuca ................. C30B 29/06
206/524.1

FOREIGN PATENT DOCUMENTS

CN          102312281 A      1/2012
CN          107247077 A      10/2017

OTHER PUBLICATIONS

Google Translation CN 107247077 A (Year: 2017).*
Taiwanese Office Action, dated Feb. 11, 2022, in a counterpart Taiwanese patent application, No. TW 110102960.

* cited by examiner

*Primary Examiner* — Lee E Rodak
*Assistant Examiner* — Courtney G McDonnough
(74) *Attorney, Agent, or Firm* — Chen Yoshimura LLP

(57) ABSTRACT

The present invention provides a method for calculating the liquid-solid interface morphology during growth of the ingot. The method comprises providing a wafer, selecting plural sampling locations on the wafer and detecting electrical resistivity at the plural sampling locations, calculating height differences between the sampling locations based on the detected electrical resistivity, and illustrating the morphology of the liquid-solid interface based on the calculated height differences. The method of the invention has advantages including easy operation and low cost.

6 Claims, 3 Drawing Sheets

METHOD FOR CALCULATING LIQUID-SOLID INTERFACE MORPHOLOGY DURING GROWTH OF INGOT

BACKGROUND OF THE INVENTION

1. Field of the Invention

The present invention relates to crystal growth, and more particularly to a method for calculating the liquid-solid interface morphology during growth of a crystal ingot.

2. Description of the Related Art

With rapid development of integrated circuit (IC), the requirements for IC-grade monocrystal silicon are more strict. Monocrystal silicon with large diameter is the essential substrate material for device manufacture. Conventionally, Czochralski method (CZ method) is the mainly process for growing monocrystal from a melt. The raw material is fed to a quartz crucible and heated to melt. A seed crystal contacts the melt surface and is pulled. Under the controlled conditions, atoms and molecules continuously rearrange at the interface between the seed crystal and the melt to grow, and the crystal ingot is formed with cooling.

Crystal growth is a phase transition process from liquid phase to solid phase along with the liquid-solid interface. However, most liquid-solid interfaces are not horizontal but curved such as protruding surface or dished surface. Regarding production of high quality ingot, it is meaningful to study the liquid-solid interface morphology during growth of semiconductor crystal.

Therefore, there is a need for a method for calculating the liquid-solid interface morphology during growth of an ingot that can solve the above problem.

SUMMARY

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

The present application describes a method for calculating the liquid-solid interface morphology during ingot growth. The method comprises:
Step S1: providing a wafer,
Step S2: selecting plural sampling locations on the wafer and detecting electrical resistivity at the plural sampling locations,
Step S3: calculating height differences between the sampling locations based on the detected electrical resistivity, and
Step S4: illustrating the morphology of the liquid-solid interface based on the calculated height differences.

Further, the wafer comprises a dopant.

Further, the Step S3 comprises: calculating doping concentrations at the sampling locations based on the detected electrical resistivity, and calculating height differences between the sampling locations based on the doping concentrations.

Further, the plural sampling locations at least comprise a first sampling location and a second sampling location, and the height difference between the first and the second sampling locations is:

$$\Delta h = h_2 - h_1 = \frac{-4M\left[1 - \left(\frac{N_1}{N_2}\right)^{\frac{1}{k_0-1}}\right]}{\rho \times \pi \times \varphi^2}$$

wherein
$\Delta h$ is the height difference between the first and the second sampling locations,
P is a crystal density,
$N_1$ is the doping concentration at the first sampling location,
$N_2$ is the doping concentration at the second sampling location,
M is the mass of the remaining silicon melt in the crucible,
$\varphi$ is the wafer diameter,
$k_0$ is the segregation coefficient of the dopant in the silicon.

Further, the second sampling location is lower than the first sampling location while the electrical resistivity of the second sampling location is more than that of the first sampling location.

Further, the second sampling location is higher than the first sampling location while the electrical resistivity of the second sampling location is less than that of the first sampling location.

Further, the second sampling location and the first sampling location have same height while the electrical resistivity of the second sampling location is equal to that of the first sampling location.

Further, the dopant comprises boron, phosphorus or arsenic.

Further, while the dopant is the second type dopant, the height difference between the first and the second sampling locations is:

$$\Delta h = h_2 - h_1 = \frac{-4M\left[1 - \left(\frac{\rho_2}{\rho_1}\right)^{\frac{1}{k_0-1}}\right]}{\rho \times \pi \times \varphi^2}$$

wherein
$\Delta h$ is the height difference between the first and the second sampling locations,
$\rho$ is a crystal density,
$\rho_1$ is the resistivity at the first sampling location,
$\rho_2$ is the resistivity at the second sampling location,
M is the mass of the remaining silicon melt in the crucible,
$\varphi$ is the wafer diameter,
$k_0$ is the segregation coefficient of the dopant in the silicon.

Further, the plural sampling locations arrange on the wafer surface radially.

According to the method of the present application, the electrical resistivity at the plural sampling locations is detected, the height differences between the sampling locations is calculated based on the detected electrical resistivity, thereby the morphology of the liquid-solid interface is illustrated. The method of the present application has advantages including easy operation and low cost.

DETAILED DESCRIPTION OF THE EMBODIMENTS

Figure 1:
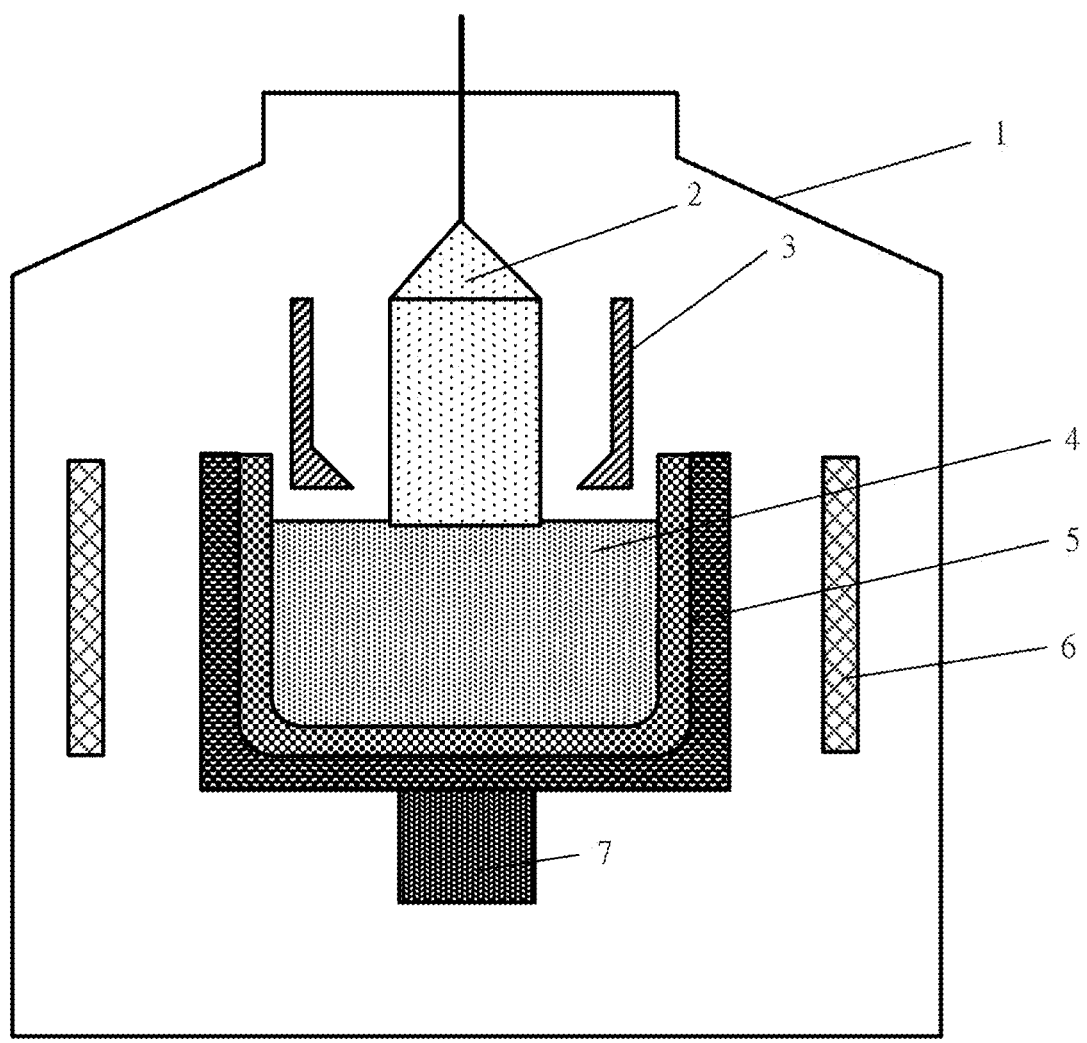
FIG. 1 is a diagram illustrating a device of ingot growth in accordance with one embodiment of the present application.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

To fully understand the present application, detailed structures or steps of the method for calculating the liquid-solid interface morphology during ingot growth are set forth in the following descriptions to explain the technical solutions of the present application. The implementation of the present application is not limited by the specific detail known by a person having ordinary skills in the art. The preferred embodiments of the present application are described in detail below, but the present application may have other embodiments in addition to the detailed description.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

As shown in FIG. 1, the device of ingot growth includes a furnace 1, a crucible 5 disposed within the furnace 1, a heater 6 surrounding the crucible 5, a silicon melt 4 carried by the crucible 5, an ingot 2 formed above the melt 4, a reflective shield 3 surrounding the ingot 2 and disposed above the crucible 5. In one embodiment, the ingot 2 is a monocrystalline silicon ingot.

In one embodiment, the furnace 1 has a stainless steel chamber full of protective gas or vacuumed. In one embodiment, the protective gas is argon with a purity of 99.999% or above, the pressure is 5 mbar-100 mbar, and the flow is 70 standard liquid per minute (slpm)-200 slpm.

In one embodiment, the crucible 5 is formed by a material with thermal resistance and corrosion resistance. The crucible 5 carries the melt 4 for crystal growth. In one embodiment, the crucible 5 includes a quartz crucible and/or a graphite crucible. The crucible 5 carries the raw material such as polycrystalline silicon. The raw material in the crucible 5 is heated to form the melt 4 for growing a monocrystalline silicon ingot. Specifically, the seed crystal is immersed into the melt, and a seed crystal shaft drives the seed crystal to rotate and pulls it slowly to grow the silicon atoms along with the seed crystal to be a monocrystalline silicon ingot. The seed crystal is formed by cutting or drilled a monocrystalline silicon having a certain crystal orientation. The general crystal orientation includes <100>, <111>, <110> and the like. The seed crystal can be cylinder.

In one embodiment, the heater 6 surrounds the outside of the crucible 5. The heater 6 can be a graphite heater disposed on the side and/or bottom of the crucible 5. It is used for ohmic heating. Further, the heater 6 includes one or more heaters surrounding the crucible 5 to achieve uniform distribution of thermal field of the crucible 5.

In one embodiment, the reflective shield 3 is disposed in the furnace 1. The reflective shield 3 locates above the crucible 5 and surrounds the outside of the ingot 2 to prevent the heat loss caused by heat radiation from the melt 4 to the furnace 1.

Further, the device of ingot growth further comprises a crucible lifting mechanism 7 to support and rotate the crucible. It can make the crucible 5 lift or drop.

In one embodiment, the growing stage of the monocrystalline silicon ingot includes seeding, shouldering, crowning, main body growing and tailing in order.

Firstly, the seeding stage is conducted. While the melt 4 achieves a certain temperature and is stable, the seed crystal is immersed into the melt 4. The seed crystal is pulled with a certain puling speed, and silicon atoms grow along with the seed crystal to form a neck with a certain diameter until a predicted neck length is achieved. The seeding stage is to eliminate dislocation defect of monocrystalline silicon caused by thermal chock. Supercooling at front edge of the crystal drives the silicon atoms to arrange in order on the silicon solid at the liquid-solid interface, so that the monocrystalline silicon is formed. In one embodiment, the puling speed is 0.3 mm/min-2.0 mm/min, the neck length is 0.6-1.4 folds of the ingot diameter, and the neck diameter is 5 mm-7 mm.

Then, it enters the shouldering stage. While the neck has the predicted length, the pulling speed for the seed crystal is decreased, and the temperature of the melt 4 is slightly decreased simultaneously. The temperature decreasing promotes horizontal growth of the monocrystalline silicon, i.e. increase of the ingot diameter. The process is called shouldering stage.

Then, it enters the crowning stage. While the ingot achieves the predicted diameter, the power of the heater 6 increases to increase the temperature of the melt 4. At the same time, the pulling speed as well as the rotation speed of the seed crystal and the rotation speed of the crucible 5 are adjusted. Accordingly, the horizontal growth is inhibited while the vertical growth is promoted to make the isometric growth of the ingot.

While the ingot achieves the predicted diameter, it enters the main body growing stage. The cylinder ingot formed in this stage is the isometric section. Specifically, the crucible temperature, the crystal pulling speed, and the rotation speeds of the crucible and the ingot are adjusted to maintain a stable growing rate and a consistent ingot diameter without change. The stage is continuous until the completion of crystal pulling. The isometric growing stage is the main stage of ingot growth, and it spends dozens of hours or even over a hundred hours.

Finally, it enters tailing stage. In this stage, the lifting rate as well as the temperature of the melt 4 increases to reduce the ingot diameter to form a cone. While the cone tip is small enough, it leaves the liquid surface. The ingot is then lifted to the upper part of the chamber and cooled for a time period. Accordingly, a cycle of growth is completed.

Regarding production of high quality ingot, it is meaningful to study the liquid-solid interface morphology during growth of semiconductor crystal. However, most liquid-solid interfaces are not horizontal but are curved such as protruding surface or dished surface. Conventionally, the main method for studying the liquid-solid interface morphology includes cutting an ingot vertically, conducting pretreatments such as polishing, etching and the like, and applying a detection method such as minority carriers life time (MCLT), X-ray topography (XRT) and the like. Or, it directly blocks the ingot growth procedure and conducts the detection. The above conventional detection methods include disadvantages such as complicated operation, high cost, and long test period and the like.

In the present application, it considers that a dopant such as boron and phosphorous solidifies at the liquid-solid interface simultaneously, so that the doping concentration at the same interface is same. However, the curved liquid surface causes that the sliced wafer has different doping concentrations at different locations, so that the resistivity of the wafer can be applied to determine the doping concentration at different locations at solidification. Thereby the liquid-solid interface morphology can be calculated.

Figure 2:
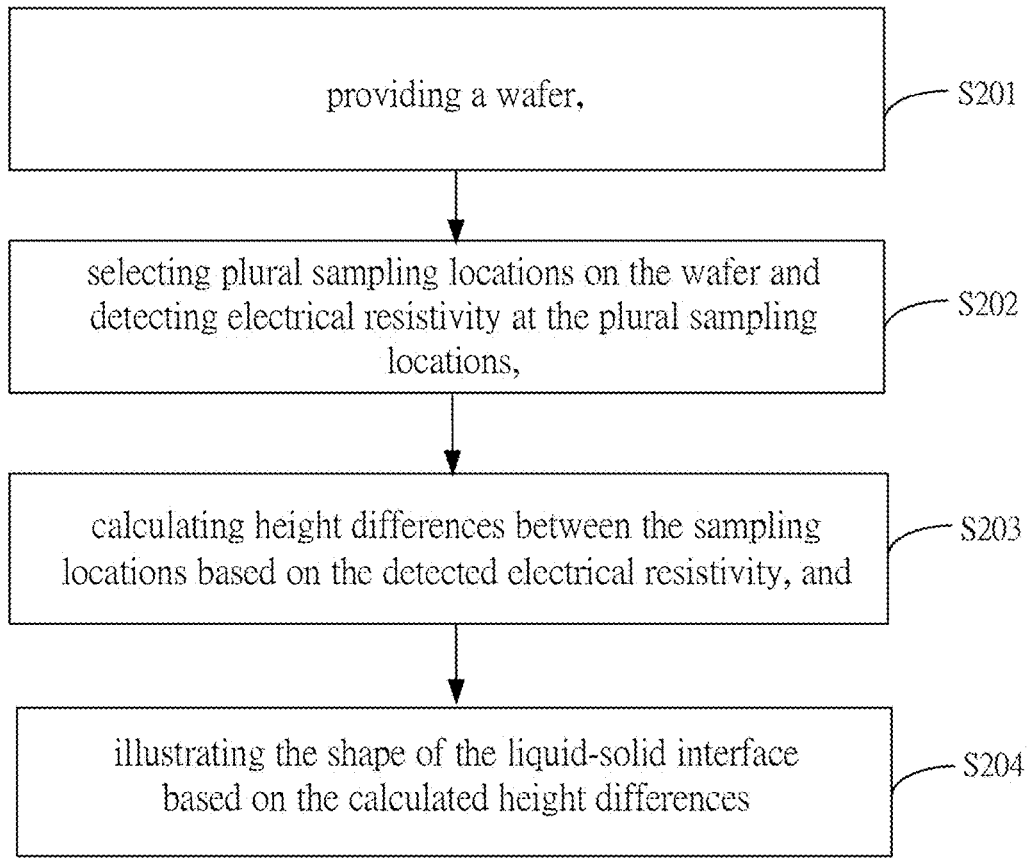
FIG. 2 is a flowchart illustrating method steps for calculating the liquid-solid interface morphology during ingot growth in accordance with one embodiment of the present application.

Regarding the above mentioned problem, the present application provides a method for calculating the liquid-solid interface morphology during ingot growth. As shown in FIG. 2, the method comprises:

Step S201: providing a wafer,

Step S202: selecting plural sampling locations on the wafer and detecting electrical resistivity at the plural sampling locations, Step S203: calculating height differences between the sampling locations based on the detected electrical resistivity, and Step S204: illustrating the morphology of the liquid-solid interface based on the calculated height differences.

Firstly, conducts Step S201: providing a wafer.

In one embodiment, the ingot formed by the above mentioned growth process can be sliced, polished, washed to form wafers. A wafer can be selected from any position of the ingot. In one embodiment, the selected wafer locates at the ingot length L. While the ingot grows to have the length L, the remaining melt 4 in the crucible 5 has a mass M. Preferably, the wafer contains monocrystalline silicon.

Further, the wafer comprises a dopant. In one embodiment, the dopant includes, but not be limited to, boron (B), phosphorus (P) or arsenic (As) during ingot growth.

Figure 4A:
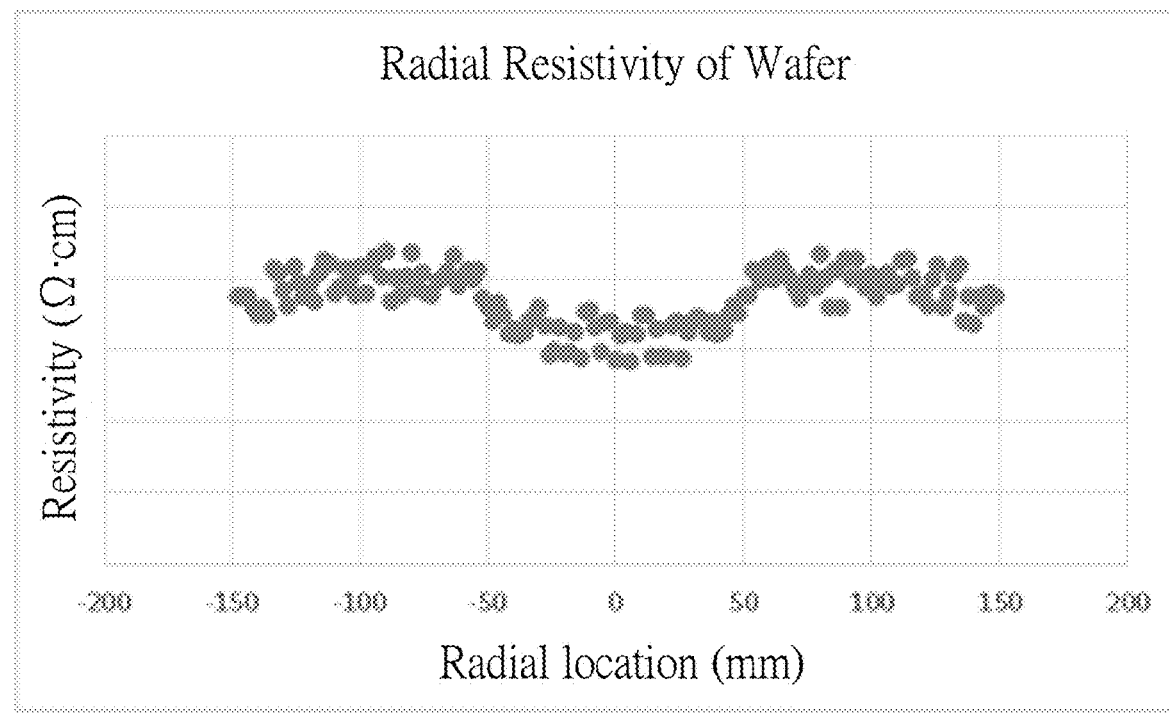
FIG. 4A shows the resistivity at the plural sampling locations in accordance with one embodiment of the present application.

Then, conducts Step S202: selecting plural sampling locations on the wafer and detecting electrical resistivity at the plural sampling locations, as shown FIG. 4A.

In one embodiment, the plural sampling locations arrange on the wafer surface radially.

In one embodiment, the plural sampling locations at least comprise a first sampling location and a second sampling location. In one embodiment, the first sampling location is at the wafer edge, and its resistivity, i.e. the edge resistivity is $\rho_0$ ($\Omega \cdot cm$), and the second sampling location is at the site on a line between the first sampling location and the wafer center and has a distance $L_i$ from the wafer edge, and its resistivity, i.e. the resistivity of Li is $\rho_i$ ($\Omega \cdot cm$).

Conducts Step S203: calculating height differences between the sampling locations based on the detected electrical resistivity.

Firstly, the doping concentrations at the sampling locations is calculated based on the detected electrical resistivity.

Figures 3A, 3B:
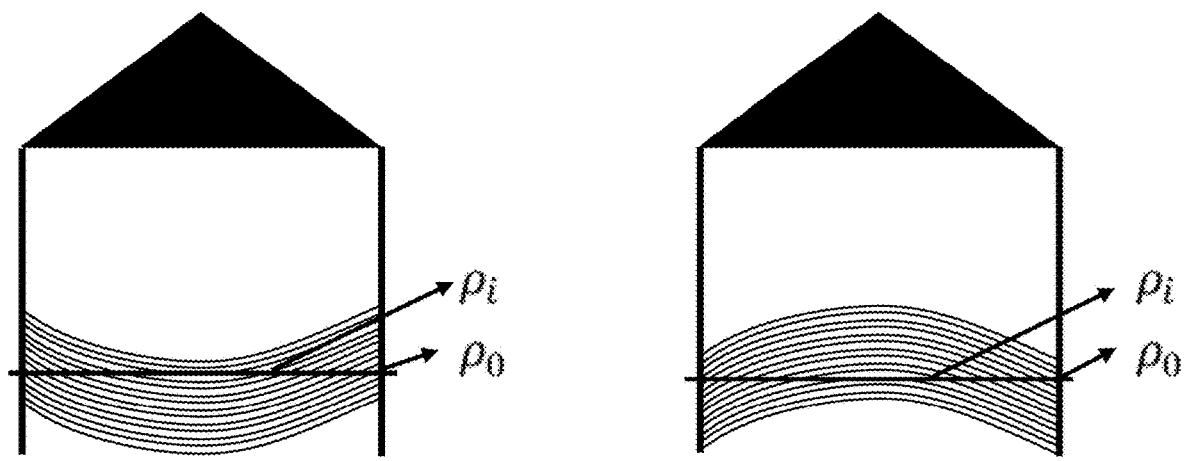
FIG. 3A is a diagram illustrating a liquid-solid interface with a downward protruding in accordance with one embodiment of the present application.
FIG. 3B is a diagram illustrating a liquid-solid interface with a upward protruding in accordance with one embodiment of the present application.

In one embodiment, referring FIG. 3A and FIG. 3B, the dopant concentrations at any site of the liquid-solid interface are same, so that each interface shown in FIG. 3A and FIG. 3B has the same resistivity. The doping concentration $N_1$ of the first sample location and the doping concentration $N_2$ of the second sample location can be calculated based on the resistivity $\rho_1$ of the first sample location and the resistivity $\rho_2$ of the second sample location.

In one illustrative embodiment, the edge resistivity is $\rho_0$ and the resistivity of $L_i$ is $\rho_i$. Correspondently, the edge doping concentration is $N_0$ (atom/cm$^3$) and the doping concentration at $L_i$ site is $N_i$ (atom/cm$^3$).

In one embodiment, while the dopant is boron (B), based on "Practice for conversion between resistivity and dopant density for boron-doped, phosphorus-doped, and arsenic-doped silicon" (GB/T13389-2014), the following equations are applied:

$$N_0 = \frac{1.330 \times 10^{15}}{\rho_0} + \frac{1.082 \times 10^{17}}{\rho_0[1 + (54.56 \times \rho_0)^{1.105}]} \quad (1)$$

$$N_i = \frac{1.330 \times 10^{16}}{\rho_i} + \frac{1.082 \times 10^{17}}{\rho_i[1 + (54.56 \times \rho_i)^{1.105}]} \quad (2)$$

In another embodiment, while the dopant is phosphorus (P), based on "Practice for conversion between resistivity and dopant density for boron-doped, phosphorus-doped, and arsenic-doped silicon" (GB/T13389-2014), the following equations are applied:

$$N_0 = \frac{6.242 \times 10^{18}}{\rho_0} \times 10^Z \quad (3)$$

$$N_i = \frac{6.242 \times 10^{18}}{\rho_i} \times 10^Z \quad (4)$$

$$Z = \frac{A_0 + A_1 x + A_2 x^2 + A_3 x^3}{1 + B_1 x + B_2 x^2 + B_3 x^3} \quad (5)$$

wherein $x = \log_{10} \rho$, A0=−3.1083, A1=−3.2626, A2=−1.2196, A3=−0.13923; B1=1.0265, B2=0.38755, B3=0.041833.

It should be explained that any practice for conversion published before or after the present application can be used to conduct the conversion between the resistivity of the doped crystal and the dopant concentration.

Then, the height differences between the sampling locations are calculated based on the doping concentrations.

While $\rho_1=\rho_2$, the second sampling location and the first sampling location have same height. In one embodiment, while $p_i=p_0$, the liquid-solid interfaces at the wafer edge and the site having a distance $L_i$ from the edge have the same height.

While $\rho_2>\rho_1$, the second sampling location is lower than the first sampling location. In one embodiment, while $\rho_i>\rho 0$, the liquid-solid interface at the site having a distance $L_i$ from the edge is lower than that at the wafer edge. It means that the shape of the liquid-solid interface protrudes downward, i.e. the interface protrudes toward the silicon melt. The liquid-solid interface has the center region lower than the edge region, as shown in FIG. 3A.

Further, based on Scheil Equation, it can obtain:

$$N_0 = k_0 \times \frac{N_i}{K_0} \times \left(1 - \frac{m}{M}\right)^{k_0-1} = N_i \times \left(1 - \frac{m}{M}\right)^{k_0-1} \quad (6)$$

wherein $N_0$ is the doping concentration at the edge, $N_i$ is the doping concentration at the site having a distance $L_i$ from the edge, M is the mass of the remaining silicon melt in the crucible, m is the mass of the solidified silicon melt while the doping concentration is from $N_i$ to $N_0$, $k_0$ is the segregation coefficient of the dopant in the silicon.

The ingot has a shape similar to cylinder, the liquid-solid interface morphology within small area is same, and the height at the edge is 0, so it can derive:

$$m = \rho \times V = \rho \times \pi \times \left(\frac{\varphi}{2}\right)^2 \times h_i \quad (7)$$

wherein $\rho$ is a crystal density,

V is the volume of the solidified silicon melt while the doping concentration is from $N_i$ to $N_0$, $\varphi$ is the wafer diameter, $h_i$ is the height of the liquid-solid interphase at the site having a distance $L_i$ from the edge.

Combining the equations (6) and (7), it can obtain:

$$h_i = \frac{4m}{\rho \times \pi \times \varphi^2} = \frac{4M\left[1 - \left(\frac{N_0}{N_i}\right)^{\frac{1}{k_0-1}}\right]}{\rho \times \pi \times \varphi^2} \quad (8)$$

wherein $h_i$ is the height of the liquid-solid interphase at the site having a distance $L_i$ from the edge, M is the mass of the remaining silicon melt in the crucible, m is the mass of the solidified silicon melt while the doping concentration is from $N_i$ to $N_0$, $\rho$ is a crystal density, $\varphi$ is the wafer diameter, $N_0$ is the doping concentration at the edge, $N_i$ is the doping concentration at the site having a distance $L_i$ from the edge, $k_0$ is the segregation coefficient of the dopant in the silicon.

While $\rho_2<\rho_1$, the second sampling location is higher than the first sampling location. In one embodiment, while $p_i<p_0$, the liquid-solid interface at the site having a distance $L_i$ from the edge is higher than that at the wafer edge. It means that the shape of the liquid-solid interface protrudes upward, i.e. the interface protrudes toward the ingot. The liquid-solid interface has the center region higher than the edge region, as shown in FIG. 2B.

Further, based on Scheil Equation, it can obtain:

$$N_i = k_0 \times \frac{N_0}{K_0} \times \left(1 - \frac{m}{m+M}\right)^{k_0-1} = N_0 \times \left(1 - \frac{m}{m+M}\right)^{k_0-1} \quad (9)$$

wherein $N_0$ is the doping concentration at the edge, $N_i$ is the doping concentration at the site having a distance $L_i$ from the edge, M is the mass of the remaining silicon melt in the crucible, m is the mass of the solidified silicon melt while the doping concentration is from $N_0$ to $N_i$, $k_0$ is the segregation coefficient of the dopant in the silicon.

The ingot has a shape similar to cylinder, the liquid-solid interface morphology within small area is same, and the height at the edge is 0, so it can derive:

$$m = \rho \times V = \rho \times \pi \times \left(\frac{\varphi}{2}\right)^2 \times h_i \quad (10)$$

wherein $\rho$ is a crystal density,

V is the volume of the solidified silicon melt while the doping concentration is from $N_i$ to $N_0$, $\varphi$ is the wafer diameter, $h_i$ is the height of the liquid-solid interphase at the site having a distance Li from the edge.

Combining the equations (9) and (10), it can obtain:

$$h_i = \frac{4m}{\rho \times \pi \times \varphi^2} = \frac{-4M\left[1 - \left(\frac{N_0}{N_i}\right)^{\frac{1}{k_0-1}}\right]}{\rho \times \pi \times \varphi^2} \quad (11)$$

wherein $h_i$ is the height of the liquid-solid interphase at the site having a distance $L_i$ from the edge, M is the mass of the remaining silicon melt in the crucible, m is the mass of the solidified silicon melt while the doping concentration is from $N_0$ to $N_i$, $\rho$ is a crystal density, $\varphi$ is the wafer diameter, $N_0$ is the doping concentration at the edge, $N_i$ is the doping concentration at the site having a distance $L_i$ from the edge, $k_0$ is the segregation coefficient of the dopant in the silicon.

It sets that $h_i$ is a positive value while the liquid-solid interface protrudes upward, i.e. protrude toward the ingot, and $h_i$ is a negative value while the liquid-solid interface protrudes downward, i.e. protrude toward the silicon melt. Combining the equations (8) and (11, it can obtain:

$$h_i = \frac{4m}{\rho \times \pi \times \varphi^2} = \frac{-4M\left[1-\left(\frac{N_0}{N_i}\right)^{\frac{1}{k_0-1}}\right]}{\rho \times \pi \times \varphi^2} \quad (12)$$

wherein $h_i$ is the height of the liquid-solid interphase at the site having a distance $L_i$ from the edge, M is the mass of the remaining silicon melt in the crucible, m is the mass of the solidified silicon melt while the doping concentration is from Ni to N0, $\rho$ is a crystal density, $\varphi$ is the wafer diameter, $N_0$ is the doping concentration at the edge, $N_i$ is the doping concentration at the site having a distance Li from the edge, $k_0$ is the segregation coefficient of the dopant in the silicon.

According to the above, it can derive the following equation:

$$\Delta h = h_2 - h_1 = \frac{-4M\left[1-\left(\frac{N_1}{N_2}\right)^{\frac{1}{k_0-1}}\right]}{\rho \times \pi \times \varphi^2}$$

wherein $\Delta h$ is the height difference between the first and the second sampling locations, $\rho$ is a crystal density, $N_1$ is the doping concentration at the first sampling location, $N_2$ is the doping concentration at the second sampling location, M is the mass of the remaining silicon melt in the crucible, $\varphi$ is the wafer diameter, $k_0$ is the segregation coefficient of the dopant in the silicon.

Further, while the dopant is phosphorous, combining the equations (3), (4), (5) and (12), it can obtain the following equation:

$$h_i = \frac{4m}{\rho \times \pi \times \varphi^2} = \frac{-4M\left[1-\left(\frac{\rho_i}{\rho_0}\right)^{\frac{1}{k_0-1}}\right]}{\rho \times \pi \times \varphi^2} \quad (14)$$

wherein $h_i$ is the height of the liquid-solid interphase at the site having a distance $L_i$ from the edge, M is the mass of the remaining silicon melt in the crucible, m is the mass of the solidified silicon melt while the doping concentration is from Ni to N0, $\rho$ is a crystal density, $\varphi$ is the wafer diameter, $\rho_0$ is the resistivity at the edge, $\rho_i$ is the resistivity at the site having a distance $L_i$ from the edge, $k_0$ is the segregation coefficient of the dopant in the silicon.

Combining the equations (3), (4), (5) and (13), it can obtain the following equation:

$$\Delta h = h_2 - h_1 = \frac{-4M\left[1-\left(\frac{\rho_2}{\rho_1}\right)^{\frac{1}{k_0-1}}\right]}{\rho \times \pi \times \varphi^2}$$

wherein $\Delta h$ is the height difference between the first and the second sampling locations, $\rho$ is a crystal density, $\rho_1$ is the resistivity at the first sampling location, $\rho_2$ is the resistivity at the second sampling location, M is the mass of the remaining silicon melt in the crucible, $\varphi$ is the wafer diameter, $k_0$ is the segregation coefficient of the dopant in the silicon.

Figure 4B:
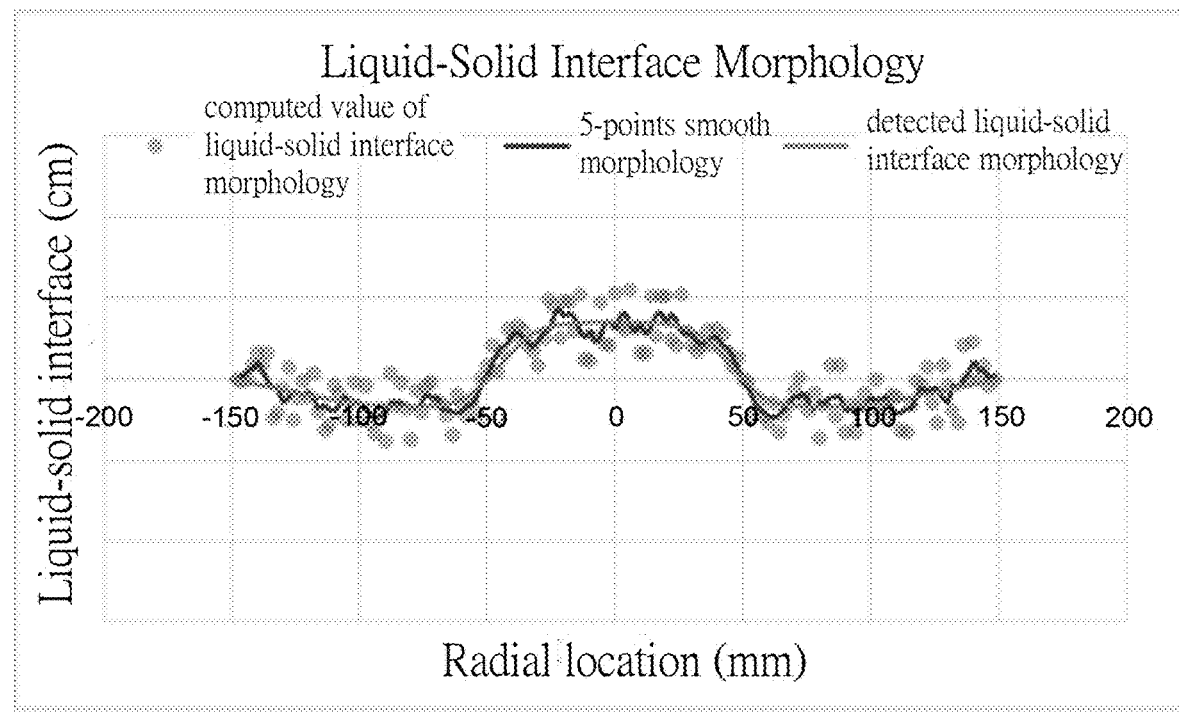
FIG. 4B shows the morphology of liquid-solid interphase illustrated based on the resistivity at the plural sampling locations in accordance with one embodiment of the present application.

Then, conduct Step S204: illustrating the morphology of the liquid-solid interface based on the calculated height differences between the plural sampling locations, as shown in FIG. 4B.

In one embodiment, the plural sampling locations further comprises a third sampling location, a fourth sampling location . . . a Nth sampling location. The third sampling location, the fourth sampling location . . . the Nth sampling location are radially arranged with the first and the second sampling locations on the wafer surface. The horizontal distance between the first sampling location and the third sampling location, the fourth sampling location . . . or the Nth sampling location. The height difference between the first and the third sampling location, the fourth sampling location . . . or the Nth sampling location is respectively calculated based on the equation (12) or the equation (14), thereby a curve can be illustrated. The curve represents the liquid-solid interface morphology.

According to the method of the present application, the electrical resistivity at the plural sampling locations on the wafer is detected, the height differences between the sampling locations is calculated based on the detected electrical resistivity, thereby the morphology of the liquid-solid interface is illustrated. The method of the present application has advantages including easy operation and low cost.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method for calculating the liquid-solid interface morphology during ingot growth comprising:
    Step S1: providing a wafer, wherein the wafer comprises a dopant,
    Step S2: selecting plural sampling locations on the wafer and detecting electrical resistivity at the plural sampling locations, wherein the plural sampling locations arrange on the wafer surface radially,
    Step S3: calculating height differences between the sampling locations based on the detected electrical resistivity, and
    Step S4: illustrating the morphology of the liquid-solid interface based on the calculated height differences;
    wherein the Step S3 comprises:
        calculating doping concentrations at the sampling locations based on the detected electrical resistivity, and calculating height differences between the sampling locations based on the doping concentrations; and wherein the plural sampling locations at least comprise a first sampling location and a second sampling location, and the height difference between the first and the second sampling locations is:

$$\Delta h = h_2 - h_1 = \frac{-4M\left[1 - \left(\frac{N_1}{N_2}\right)^{\frac{1}{k_0-1}}\right]}{\rho \times \pi \times \varphi^2}$$

wherein $\Delta h$ is the height difference between the first and the second sampling locations, $\rho$ is a crystal density, $N_1$ is the doping concentration at the first sampling location, $N_2$ is the doping concentration at the second sampling location, M is the mass of the remaining silicon melt in the crucible, $\varphi$ is the wafer diameter, and $k_0$ is the segregation coefficient of the dopant in the silicon.

2. The method of claim 1, wherein the second sampling location is lower than the first sampling location while the electrical resistivity of the second sampling location is more than that of the first sampling location.

3. The method of claim 1, wherein the second sampling location is higher than the first sampling location while the electrical resistivity of the second sampling location is less than that of the first sampling location.

4. The method of claim 1, wherein the second sampling location and the first sampling location have same height while the electrical resistivity of the second sampling location is equal to that of the first sampling location.

5. The method of claim 1, wherein the dopant comprises boron, phosphorus or arsenic.

6. The method of claim 5, wherein, while the dopant is phosphorus.

* * * * *